United States Patent
Lin et al.

[11] Patent Number: 6,033,965
[45] Date of Patent: Mar. 7, 2000

[54] PROCESS FOR FABRICATING MIXED SIGNAL INTEGRATED CIRCUIT

[75] Inventors: Chen-Bin Lin, Taipei; Feng-Ming Liu, Feng-Shan; James Ho, Taichung; Yu-Ju Liu, Hsinchu, all of Taiwan

[73] Assignee: United Microelectronics Corp., Taiwan

[21] Appl. No.: 09/363,074

[22] Filed: Jul. 28, 1999

[51] Int. Cl.⁷ .................. H01L 21/20; H01L 21/8242
[52] U.S. Cl. .................. 438/395; 438/393; 438/396; 438/250; 438/252; 438/239
[58] Field of Search ...................... 438/239, 253, 438/396, 657, 514, 519, 251, 250, 252, 289, 393, 394, 395

[56] References Cited

U.S. PATENT DOCUMENTS

5,434,098   7/1995   Chang ........................ 438/396

*Primary Examiner*—Charles Bowers
*Assistant Examiner*—Hsien-Ming Lee
*Attorney, Agent, or Firm*—Martine Penilla & Kim, LLP

[57] ABSTRACT

A process for fabricating a mixed signal integrated circuit on a substrate, wherein the substrate is partially covered with a field oxide layer. An oxide layer is formed over a portion of the substrate, wherein the portion of the substrate is not covered with the field oxide layer. First impurities are implanted into the substrate, wherein the first impurities damage the oxide layer. A buffer layer is formed over the oxide layer. A polysilicon layer is formed over the buffer layer. Second impurities are implanted into the polysilicon layer, wherein the buffer layer prevents the oxide layer form being damaged by the second impurities. The polysilicon layer is etched to remove the polysilicon layer, wherein the buffer layer prevents the oxide layer and the substrate from being etched. The portion of buffer layer and the damaged oxide layer over the substrate are removed. The gate oxide layer is formed over the substrate.

19 Claims, 7 Drawing Sheets

PROCESS FOR FABRICATING MIXED SIGNAL INTEGRATED CIRCUIT

BACKGROUND OF THE INVENTION

1. Field of Invention

The present invention relates to a process for fabricating an integrated circuit More particularly, the present invention relates to a process for fabricating a mixed signal integrated circuit.

2. Description of Related Art

FIGS. 1A–1F are schematic, cross-sectional views of a conventional process for fabricating a mixed signal integrated circuit.

Figure 1A:
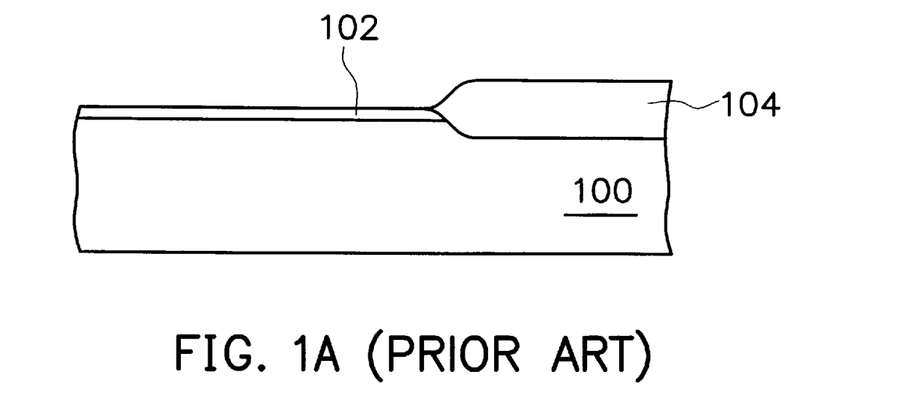
FIGS. 1A–1F are schematic, cross-sectional views of a process for fabricating a mixed signal integrated circuit.

As shown in FIG. 1A, a substrate 100 is provided, wherein the substrate 100 is covered with an oxide layer 102 and a field oxide layer 104.

Figure 1B:
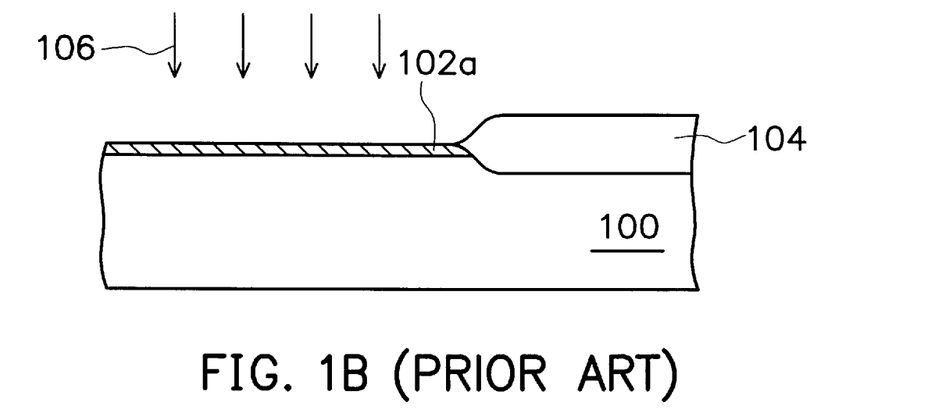

As shown in FIG. 1B, a first implantation step 106 is performed to adjust threshold voltage by using the oxide layer 102 (shown in FIG. 1A) as a sacrificial layer. The oxide layer 102 is often damaged in this implantation 106, and the damaged oxide layer is represented by reference number 102a.

Figure 1C:
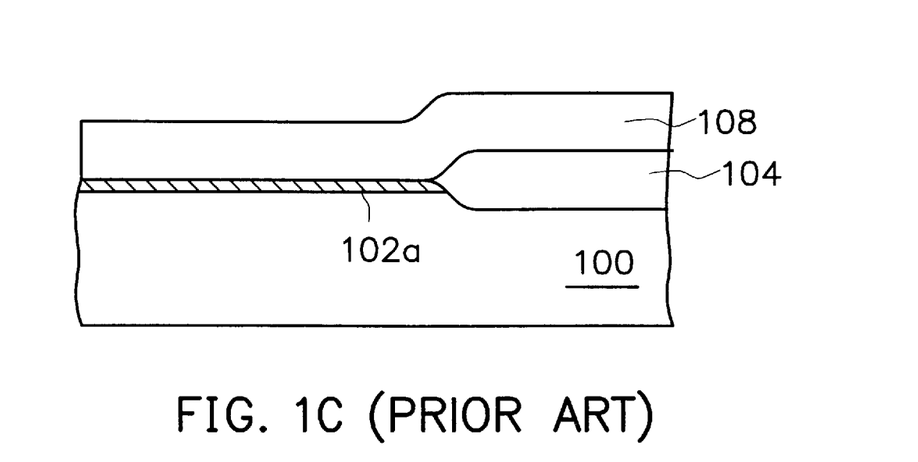

As shown in FIG. 1C, a polysilicon layer 108 is formed to cover the field oxide layer 104 and the oxide layer 102a.

Figure 1D:
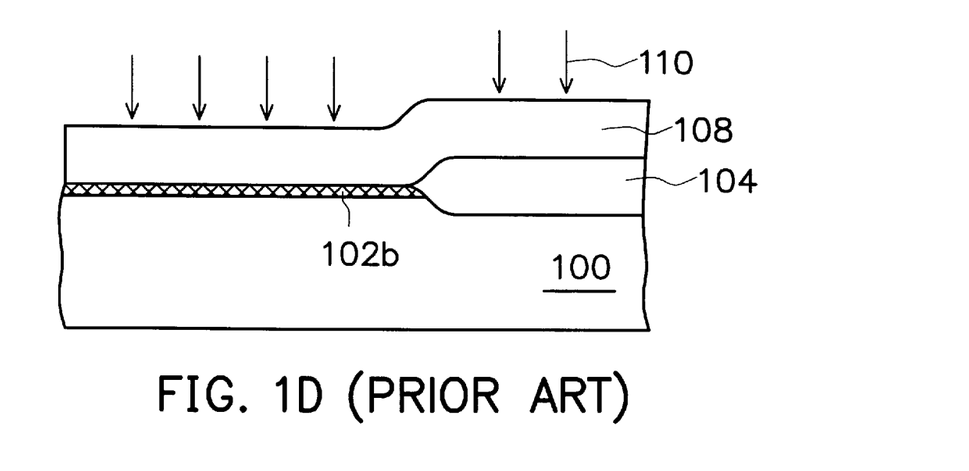

As shown in FIG. 1D, a second implantation step 110 is performed, so that the polysilicon layer 108 has impurities to increase the conductivity. Beneath the polysilicon layer 108, the oxide layer 102a (shown in FIG. 1C) is often further damaged to form weak points (not shown) during this second implantation step 110. The oxide layer with the weak points is represented by reference number 102b. One of the reasons why the damages occur is that the accelerated impurities cause an implant charging effect on the oxide layer 102a. After the second implantation step 110, an annealing step is performed.

Figure 1E:
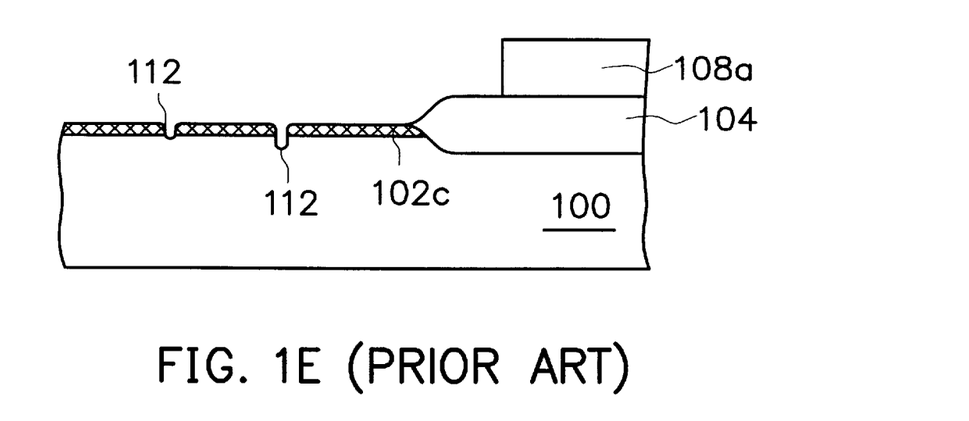

As shown in FIG. 1E, the polysilicon layer 108 (shown in FIG. 1D) is patterned by a photolithography-etching method to form a bottom polysilicon plate 108a over the field oxide layer 104. In this patterning step, the oxide layer 102b (shown in FIG. 1D) is used as an etching stop layer. However, the etching stop layer cannot prevent the substrate 100 and the oxide layer 102b (shown in FIG. 1D) from being etched. The etching source often etches through the weak points of the oxide layer 102b and into the substrate 100 to form pits 112. After this patterning step, the oxide layer is represented by reference number 102c.

Figure 1F:
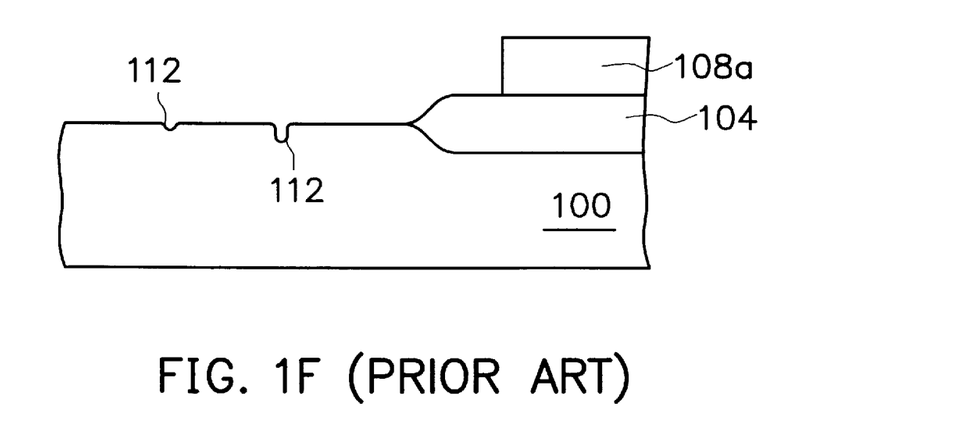

As shown in FIG. 1F, the oxide layer 102c (shown in FIG. 1E) is removed. After the oxide layer 102c is removed, a gate oxide layer (not shown) is grown on the substrate 100. The gate oxide layer is grown with poor quality, because the substrate 100 has the pits 112 thereon. Due to the poor quality, the gate oxide layer decreases the induced breakdown voltage, and therefore decreases the yield of the mixed signal integrated circuit. Other steps for fabricating the mixed signal integrated circuit are easily accomplished by persons skilled in the art and are thus omitted here.

SUMMARY OF THE INVENTION

The invention provides a process for fabricating a mixed signal integrated circuit on a substrate, wherein the substrate is partially covered with a field oxide layer. An oxide layer is formed over a portion of the substrate, wherein the portion of the substrate is not covered with the field oxide layer. First impurities are implanted into the substrate. A buffer layer is formed over the oxide layer and the field oxide layer. A polysilicon layer is formed over the buffer layer. Second impurities are implanted into the polysilicon layer. The polysilicon layer is etched using the buffer layer as an etching stop layer, so that a bottom polysilicon plate is formed over the field oxide layer. The buffer layer and the damaged oxide layer are removed over the portion of the substrate. A gate oxide layer and a gate are sequentially formed over the portion of the substrate. A dielectric layer and a top polysilicon plate are sequentially formed over the bottom polysilicon plate.

In this process, the present invention provides a buffer layer to prevent gate oxide layer failure, thereby enhancing the quality of the gate oxide layer, and thereby increasing the yield of the mixed signal integrated circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A–2G are schematic, cross-sectional views of a process for fabricating a mixed signal integrated circuit according to one preferred embodiment of this invention.

Figure 2A:
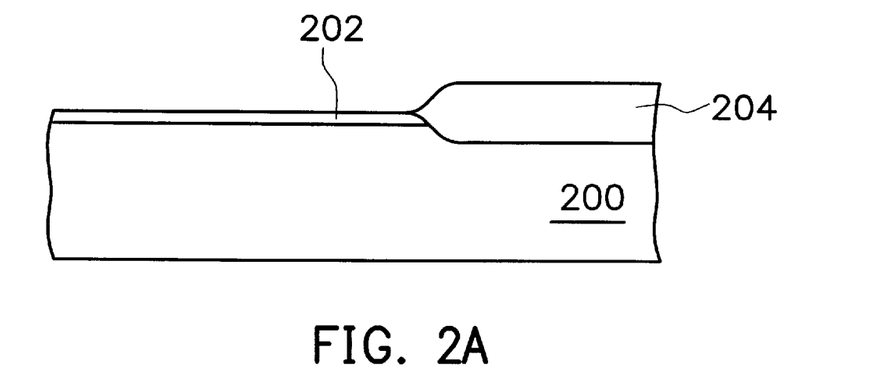
FIGS. 2A–2G are schematic, cross-sectional views of a process for fabricating a mixed signal integrated circuit according to one preferred embodiment of this invention.

Referring to FIG. 2A, a substrate 200 is provided, wherein the substrate 200 is partially covered with a field oxide layer 204. Without the field oxide layer 204 thereon, a portion of the substrate 200 is covered with an oxide layer 202. The oxide layer 202, formed by thermal oxidation, serves as a sacrificial layer (or screen layer) during subsequent implantation.

Figure 2B:
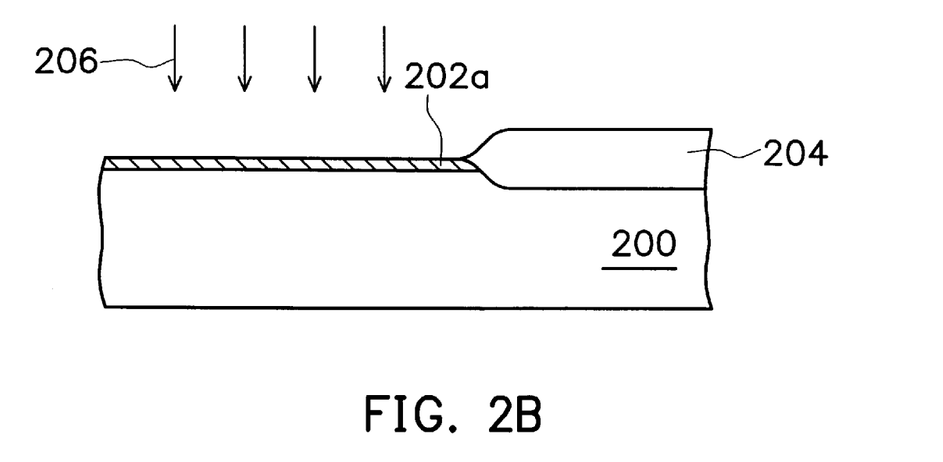

Referring to FIG. 2B, a first implantation step 206 is performed by using the oxide layer 202 (shown in FIG. 2A) as a sacrificial layer. In this first implantation step 206, impurities are ionized and accelerated towards the substrate 200 to adjust threshold voltage or to accomplish other purposes according to the uses of the mixed signal integrated circuit. The accelerated impurities often damage the oxide layer 202, and the damaged oxide layer is represented by a reference number 202a.

Figure 2C:
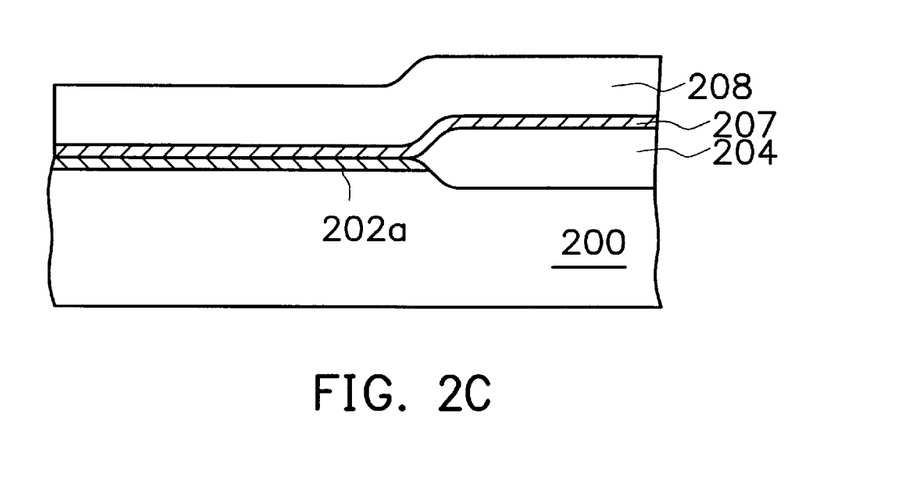

Referring to FIG. 2C, a buffer layer 207 and a polysilicon layer 208 are sequentially formed over the oxide layer 202a and the field oxide layer 204. The buffer layer 207 is formed by, for example, depositing a material to a thickness of from about several hundred to a thousand angstroms. The material, different from that of the polysilicon layer 208, can be oxide, nitride, oxynitride, or other dielectric materials.

Figure 2D:
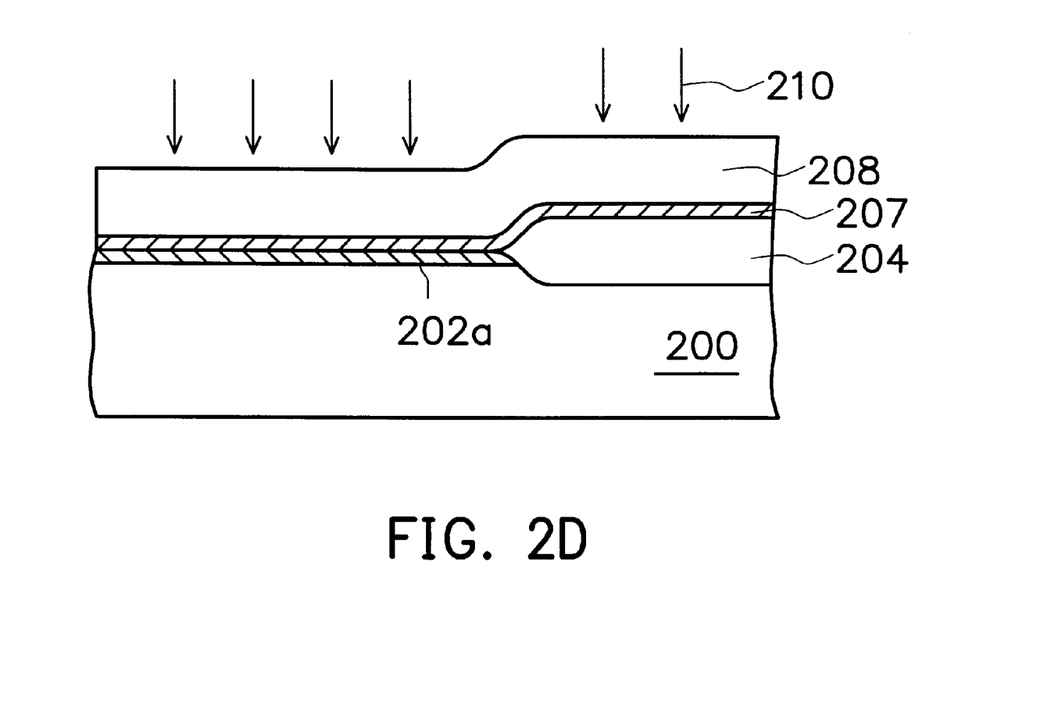

Referring to FIG. 2D, a second implantation step 210 is performed, in which impurities are ionized and accelerated towards the polysilicon layer 208. Even if the accelerated impurities cause an implant charging effect, they cannot damage the oxide layer 202a in this second implantation step 210, because the buffer layer 207 protects the oxide layer 202a from being damaged. After the second implantation step 210, an annealing step is performed, and the polysilicon layer 208 with the implanted impurities thus possesses an improved conductivity.

Figure 2E:
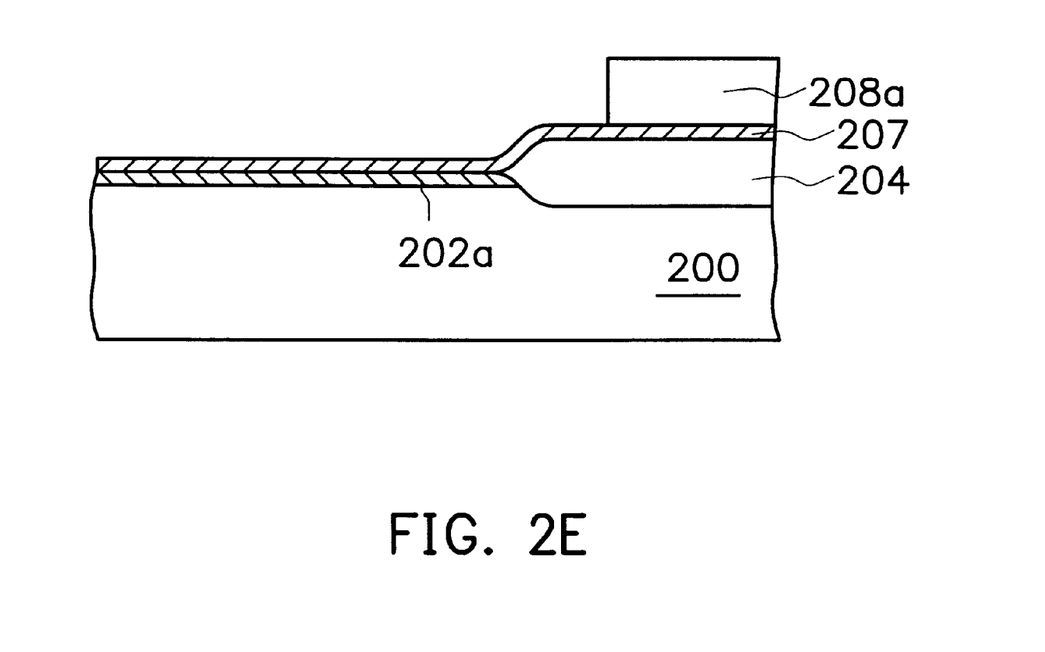

Referring to FIG. 2E, the polysilicon layer 208 (shown in FIG. 2D) is patterned by a photolithography-etching method to form a bottom polysilicon plate 208a over the field oxide layer 204. The buffer layer 207, instead of the oxide layer 202a, is used as an etching stop layer in this patterning step. Covered by the buffer layer 207, the oxide layer 202a has no possibility to contact with the etching source when the polysilicon layer 208 is patterned. Since the oxide layer 202a does not contact the etching source, the substrate 200 covered by the oxide layer has no pits formed therein.

Figure 2F:
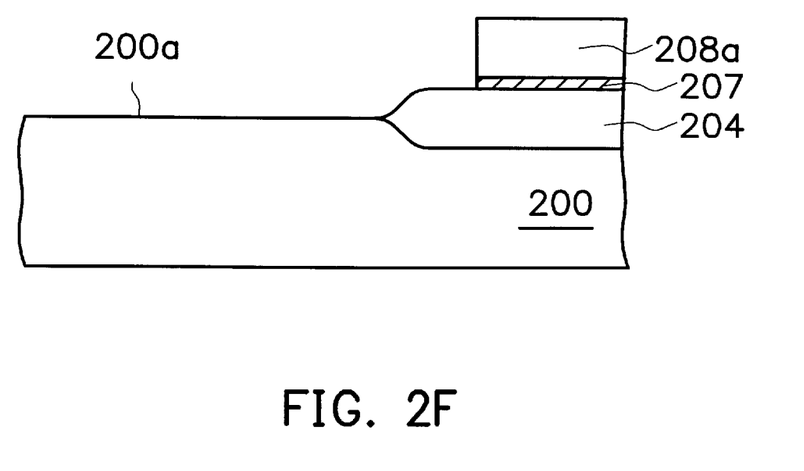

Referring to FIG. 2F, the oxide layer 202a (shown in FIG. 2E) and the buffer layer 207 (shown in FIG. 2E) are etched using the bottom polysilicon plate 208a as an etching mask, so that the oxide layer 202a and the buffer layer 207 are removed except for what is covered by the bottom polysilicon plate 207.

Figure 2G:
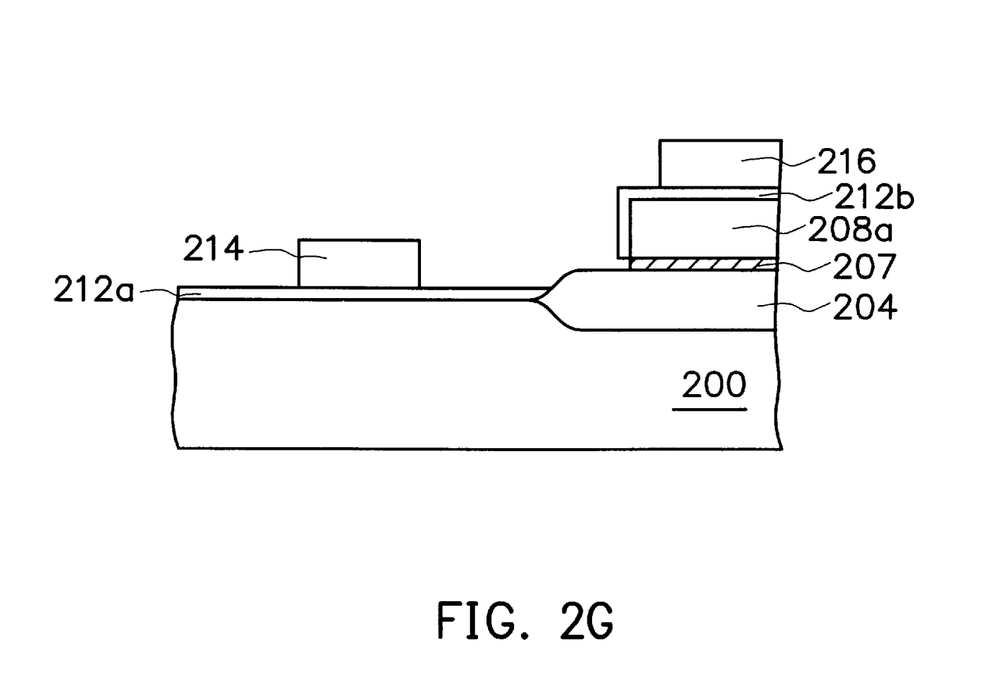

Referring to FIG. 2G, a thermal oxidation step is performed to form a gate oxide layer 212a and a thin oxide layer 212b. The gate oxide layer 212a is formed on a portion of the substrate 200 with no field oxide layer thereon, while the thin oxide layer 212b is formed on the bottom polysilicon plate 208a. Because the substrate 200 is smooth and has no pits therein, the gate oxide layer 212a can be formed with high quality.

Still referring to FIG. 2G, a gate 214 and a top polysilicon plate 216 are formed over the gate oxide layer 212a and the thin oxide layer 212b, respectively. After this formation step, other steps can be easily accomplished by persons skilled in the art, and are thus omitted here.

Figure 3A:
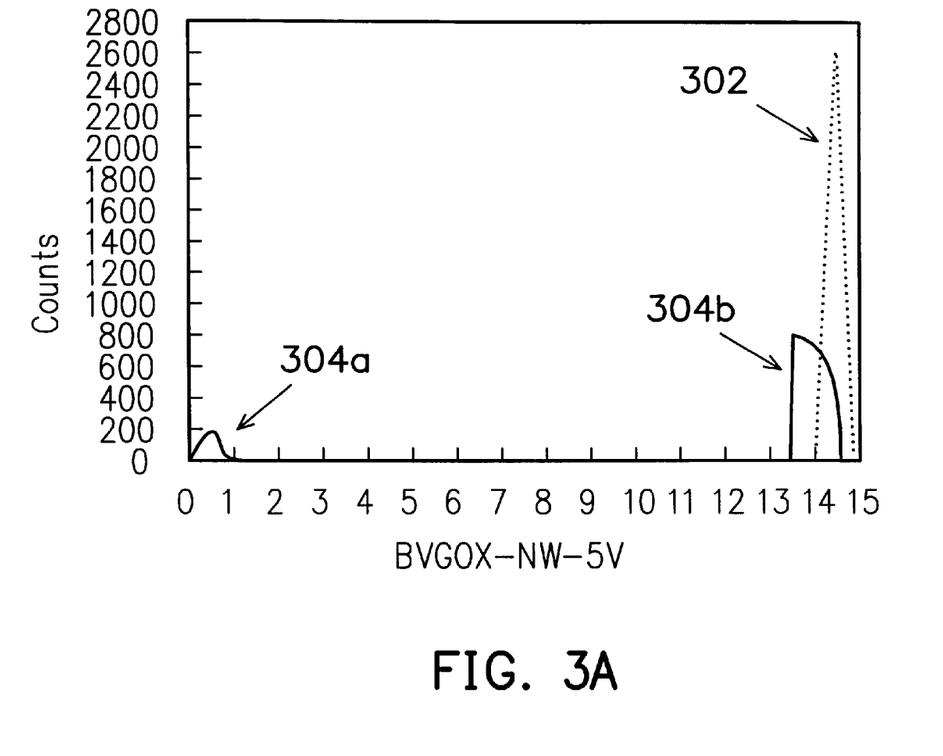
FIG. 3A and FIG. 3B schematically illustrate the result of a breakdown voltage test performed on each die of the mixed signal integrated circuits.

A breakdown voltage test is performed on each die of the mixed signal integrated circuit formed by the above method. The result of the test is shown in FIG. 3A, where a horizontal axis represents breakdown voltages, and a vertical axis represents counts of the breakdown voltages. In FIG. 3A, BVGOX-NW-5V serves as a reference unit for the breakdown voltages.

FIG. 3A shows a single peak 302 drawn as a dot line, and dual peaks 304a, 304b drawn as solid lines. The single peak 302 represents measurements according to the preferred embodiment of this invention, while the dual peaks 304a, 304b represent measurements according to a conventional process for fabricating a mixed signal integrated circuit.

Figure 3B:
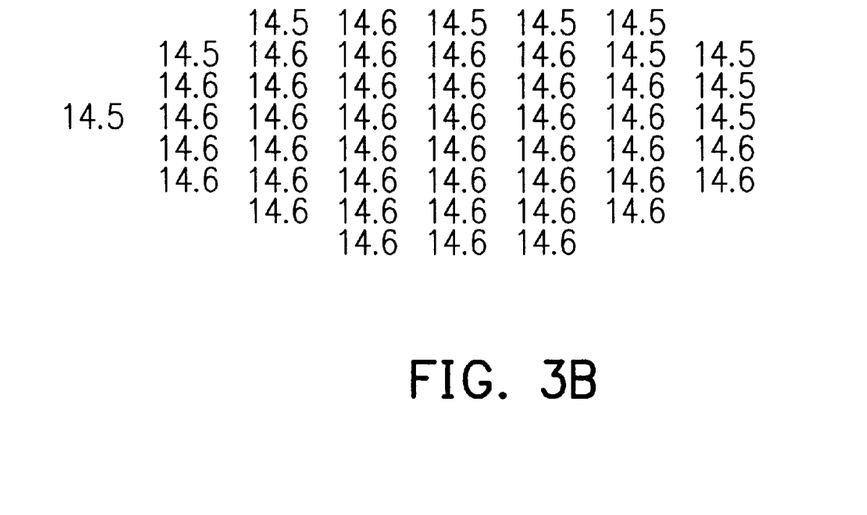

Although some mixed signal integrated circuit dies fabricated by a conventional method have normal breakdown voltages as shown in the right dual peak 304b, others have breakdown voltages extremely low to almost zero, which are not sufficiently high for normal operation, as shown in the left dual peak 304a. However, unlike the conventional method, most of the mixed signal integrated circuit dies fabricated by this present invention have normal breakdown voltages of about 14.5 to about 14.6 voltages, as shown in the single peak 302. This improvement is also shown in FIG. 3B, where a voltages distribution of the dies on a wafer applied this present invention is plotted. As plotted, each die has breakdown voltages of about 14.5 to about 14.6 voltages, and no die has inoperative breakdown voltage.

Figure 4:
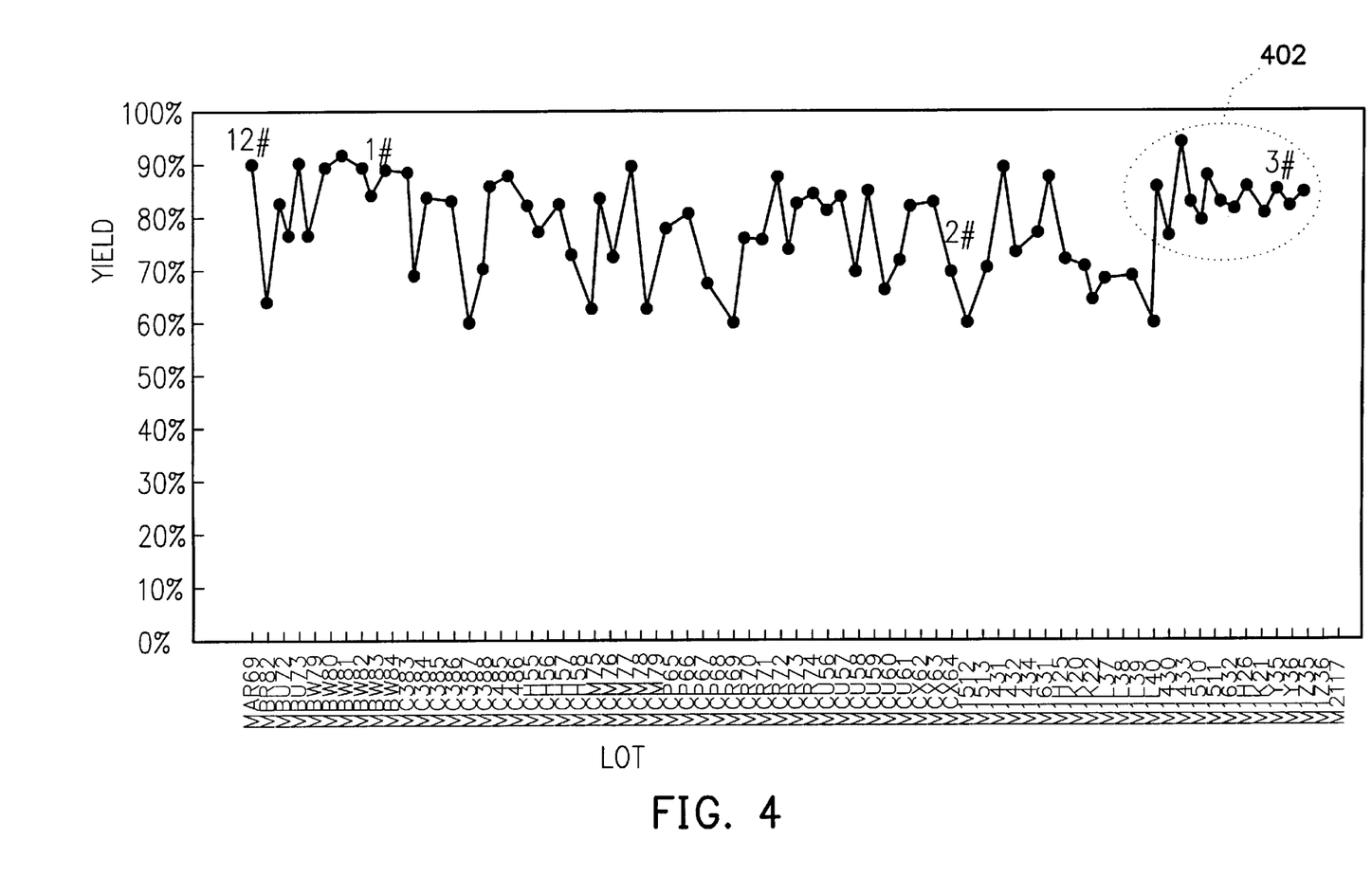
FIG. 4 shows yields of different lots of mixed signal integrated circuit (MSIC) products in a lot-yield graph.

FIG. 4 shows yields of different lots of mixed signal integrated circuit (MSIC) products in a lot-yield graph. In FIG. 4, a horizontal axis represents lots of MSIC products, and a vertical axis represents yields of MSIC product lots. The yields of MSIC products fabricated according to this invention are plotted in the area circled by a dotted line 402. Other measurements plotted outside that area represent the yields of conventional MSIC products. As shown in the dotted circle 402, the MSIC products fabricated according to this invention have the yields of about 80% to 85%, which is higher than that of conventional MSIC products. Moreover, the fluctuation of the yield is apparently smoother than that of the conventional MSIC products.

One of the reasons why the conventional MSIC products have lower yields is that they do not use a buffer layer in the fabrication processes. Without the use of a buffer layer, the substrates of the conventional MSIC products are easily damaged in the fabrication processes, thereby lowering the quality of the gate oxides grown on the substrate, and thereby reducing the yields of the conventional MSIC products.

In this process for fabricating a mixed signal integrated circuit, the present invention provides a buffer layer to prevent gate oxide layer failure, thereby raising the quality of the gate oxide layer, and thereby increasing the yield of the mixed signal integrated circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for fabricating a mixed signal integrated circuit on a substrate, wherein the substrate is partially covered with a field oxide layer, the process comprising:

forming an oxide layer over a portion of the substrate, wherein the portion of the substrate is not covered with the field oxide layer;

implanting first impurities into the substrate;

forming a buffer layer over the oxide layer and the field oxide layer;

forming a polysilicon layer over the buffer layer;

implanting second impurities into the polysilicon layer;

etching the polysilicon layer using the buffer layer as an etching stop layer, so that a bottom polysilicon plate is formed over the field oxide layer;

removing the buffer layer and the damaged oxide layer over the portion of the substrate;

sequentially forming a gate oxide layer and a gate over the portion of the substrate; and sequentially forming a dielectric layer and a top polysilicon plate over the bottom polysilicon plate.

2. The method of claim 1, wherein the buffer layer is made of oxide.

3. The method of claim 1, wherein the buffer layer is made of nitride.

4. The method of claim 1, wherein the buffer layer is made of oxynitride.

5. The method of claim 1, wherein the gate oxide layer is formed by thermal oxidation.

6. The method of claim 1, wherein the first and the second impurities are implanted by an ion implantation technique.

7. A process for fabricating a mixed signal integrated circuit on a substrate, wherein the substrate is partially covered with a field oxide layer, the process comprising:

forming a sacrificial layer over a portion of the substrate, wherein the portion of the substrate is not covered with the field oxide layer;

implanting impurities into the substrate, wherein the impurities damage the sacrificial layer;

protecting the sacrificial layer from being further damaged by forming a buffer layer over the sacrificial layer;

forming a bottom plate over the field oxide layer;

removing the buffer layer and the sacrificial layer over the portion of the substrate;

sequentially forming a gate oxide layer and a gate over the portion of the substrate; and sequentially forming a dielectric layer and a top plate over the bottom plate.

8. The method of claim 7, wherein the buffer layer is made of oxide.

9. The method of claim 7, wherein the buffer layer is made of nitride.

10. The method of claim 7, wherein the buffer layer is made of oxynitride.

11. The method of claim 7, wherein the gate oxide layer is formed by thermal oxidation.

12. The method of claim 7, wherein the top and the bottom plates are made of polysilicon.

13. A method for preventing a gate oxide layer from failing, wherein the gate oxide layer is predetermined to be formed over a substrate, the method comprising:

forming an oxide layer over the substrate;

implanting first impurities into the substrate, wherein the first impurities damage the oxide layer;

forming a buffer layer over the oxide layer;

forming a polysilicon layer over the buffer layer;

implanting second impurities into the polysilicon layer, wherein the buffer layer prevents the oxide layer form being damaged by the second impurities;

etching the polysilicon layer to remove the polysilicon layer, wherein the buffer layer prevents the oxide layer and the substrate from being etched;

removing the buffer layer and the damaged oxide layer over the portion of the substrate; and forming the gate oxide layer over the substrate.

14. The method of claim 13, wherein the buffer layer is made of oxide.

15. The method of claim 13, wherein the buffer layer is made of nitride.

16. The method of claim 13, wherein the buffer layer is made of oxynitride.

17. The method of claim 13, wherein the gate oxide layer is formed by thermal oxidation.

18. The method of claim 13, wherein the first and the second impurities are implanted by an ion implantation technique.

19. The method of claim 13, further comprising the step of forming a gate over the gate oxide layer.

* * * * *